US007622998B2

(12) United States Patent
Amantea

(10) Patent No.: US 7,622,998 B2
(45) Date of Patent: Nov. 24, 2009

(54) SOLID STATE INTRA-CAVITY ABSORPTION SPECTROMETER

(75) Inventor: Robert Amantea, Manalapan, NJ (US)

(73) Assignee: Sarnoff Corporation, Princeton, NJ (US)

( * ) Notice: Subject to any disclaimer, the term of this patent is extended or adjusted under 35 U.S.C. 154(b) by 612 days.

(21) Appl. No.: 11/562,455

(22) Filed: Nov. 22, 2006

(65) Prior Publication Data

US 2007/0121687 A1 May 31, 2007

Related U.S. Application Data

(60) Provisional application No. 60/738,949, filed on Nov. 22, 2005.

(51) Int. Cl.
*H03B 7/14* (2006.01)
*G01J 3/00* (2006.01)

(52) U.S. Cl. ........................................ 331/56; 356/300

(58) Field of Classification Search .................. 331/56; 356/300

See application file for complete search history.

(56) References Cited

U.S. PATENT DOCUMENTS

| | | | | |
|---|---|---|---|---|
| 3,953,702 A * | 4/1976 | Bickel | ........................ | 219/761 |
| 2004/0227088 A1 | 11/2004 | Trotz et al. | | |

OTHER PUBLICATIONS

Hirotaka Kondo et al., "Millimeter and Submillimeter Wave Quasi-Optical Oscillator with Multi-Elements" IEEE Transactions in Microwave Theory and Techniques, vol. 40, No. 5, pp. 857-863 (May 1992).

* cited by examiner

*Primary Examiner*—David Mis
(74) *Attorney, Agent, or Firm*—Lowenstein Sandler PC

(57) ABSTRACT

The present invention provides a solid state intra-cavity absorption spectrometer comprising a solid-state gain device interspersed in an array of oscillators in a chamber to produce a wide area coherent high power source of Terahertz radiation. The source is then partitioned into two separate regions, one having a gain medium and one having a sample chamber that can be held a different pressure and is chemically isolated from the gain region thereby forming an intra-cavity absorption spectrometer.

18 Claims, 4 Drawing Sheets

SOLID STATE INTRA-CAVITY ABSORPTION SPECTROMETER

CROSS-REFERENCE TO RELATED APPLICATIONS

This application claims the benefit of U.S. Provisional Patent Application No. 60/738,949 filed Nov. 22, 2005, the entire disclosure of which is incorporated herein by reference.

FIELD OF THE INVENTION

The present invention relates generally relates to a field of Terahertz (THz) components and more particularly to the generation of high-power THz radiation using solid-state components for use in an absorption spectrometer.

BACKGROUND OF THE INVENTION

Power combining is typically done using resonant waveguide cavities or transmission-line feed networks. These approaches, however, have a number of shortcomings that become especially apparent at higher frequencies. First, conductor losses in the waveguide walls or transmission lines tend to increase with frequency, eventually limiting the combining efficiency. Second, these combiners become increasingly difficult to machine as the wavelength gets smaller. Third, in waveguide systems, each device often must be inserted and tuned manually. This is labor-intensive and only practical for a relatively small number of devices.

A known solution is proposed in an article by Kondo et al entitled "*Millimeter and Submillimeter Wave Quasi-Optical Oscillataor with Multi-Elements*". The article provides a guide to development of many kinds of oscillators in solid state devices. Solid state devices have many advantages, i.e. small size, light weight and low-voltage power supplies. The article discloses a quasi-optical oscillator having solid-state devices (Gunn Diodes, GaAsMeSFET etc.) mounted in the grooved mirror to obtain a coherent power-combining and frequency locking.

Now referring to FIG. 1, there is illustrated a conventional current approach to an intra-cavity absorption spectrometer (IAS) 100 using the Smith-Purcell effect (electron beam interacting with a grating) and an open resonant chamber in a semi-confocal configuration. The resonator is partitioned into two parts, the lower part being the vacuum chamber 102 containing the electron beam 104 and grating 106 are held at high vacuum ~$10^{-7}$ Torr while the upper part being the sample chamber 108 which is held in the range of $10^{-7}$ Torr. A thin window 110 separates the high-vacuum region of the electron beam and the grating from the sample chamber. The resonator is formed by a spherical mirror 112 at the top and the grating 106 as shown in FIG. 1. Also, included is a plane mirror 114 upon which the grating 106 resides. This device 100 also requires a large axial magnetic field (~1 Tesla) to be aligned with the electron beam. In its operation, the device 100 relies upon the THz gain provided by the electron beam interaction with the grating and the resonant chamber to become an oscillator, The major difficulty of this approach is the critical alignment of the electron beam to the magnetic field and the grating. Misalignments cause poor power efficiency and reduced sensitivity. Thus, there is a need in the art to provide an improved Terahertz system to overcome the disadvantages of the prior art.

Figure 3:
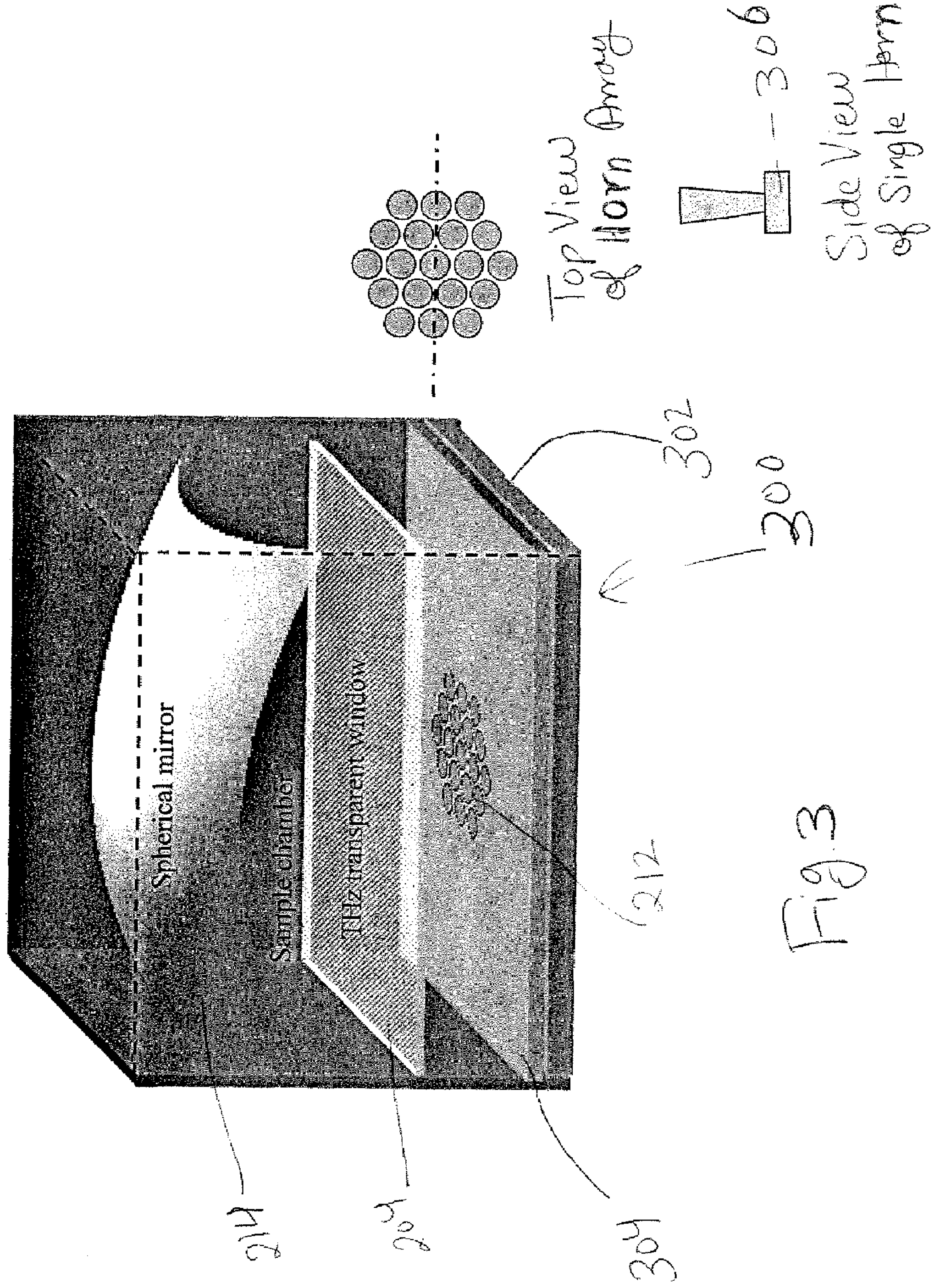
FIG. 3 illustrates a schematic configuration of an intra-cavity absorption spectrometer in accordance with another embodiment of the present invention.

4A illustrates a cross-section of the resonator and the gain elements shown in FIG. 3 in accordance with another embodiment of the present invention.

Figure 4A:
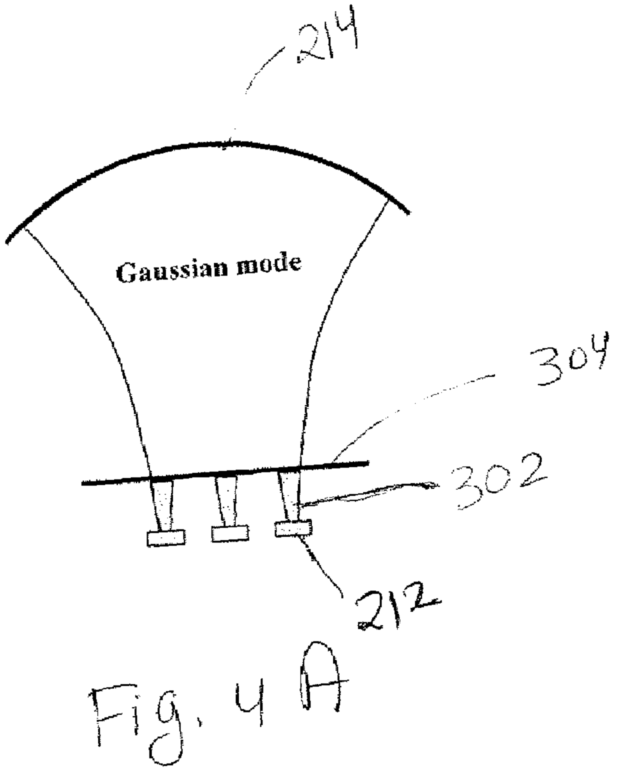
Figure 4B:
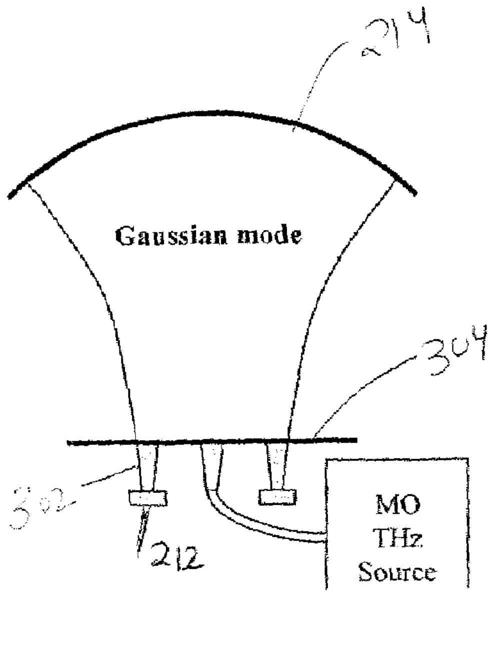

FIG. 4B illustrates a cross-section of the resonator and the gain elements shown in FIG. 3 in accordance with an alternate embodiment of the present invention.

It is understood that the attached drawings are for the purpose of illustrating the concepts of the invention and may not be to scale.

DETAILED DESCRIPTION OF THE INVENTION

In one embodiment of the present invention, the gain mechanism (the electron beam and grating) were replaced with an array of solid-state devices that preferably provide gain in the same frequency range, then an all solid-state Intra-cavity absorption spectrometer (IAS) could be fabricated. This approach would not only avoid the critical alignment problem but also would eliminate the need for high vacuum chambers and yield the greater reliability that solid stated devices generally provide relative to electron beam devices.

In another embodiment of the present invention, there is provided an intra-cavity absorption spectrometer (IAS) using the semi-confocal resonant chamber to couple all array of oscillators to produce a wide area, coherent high power source of THz radiation, preferably in the range of 0.1 to 1.0 THz. The source can then be partitioned into two separate regions. One containing the gain medium and one containing a sample chamber that can be held a different pressure and is chemically isolated from the gain region thereby forming an IAS.

Figure 1:
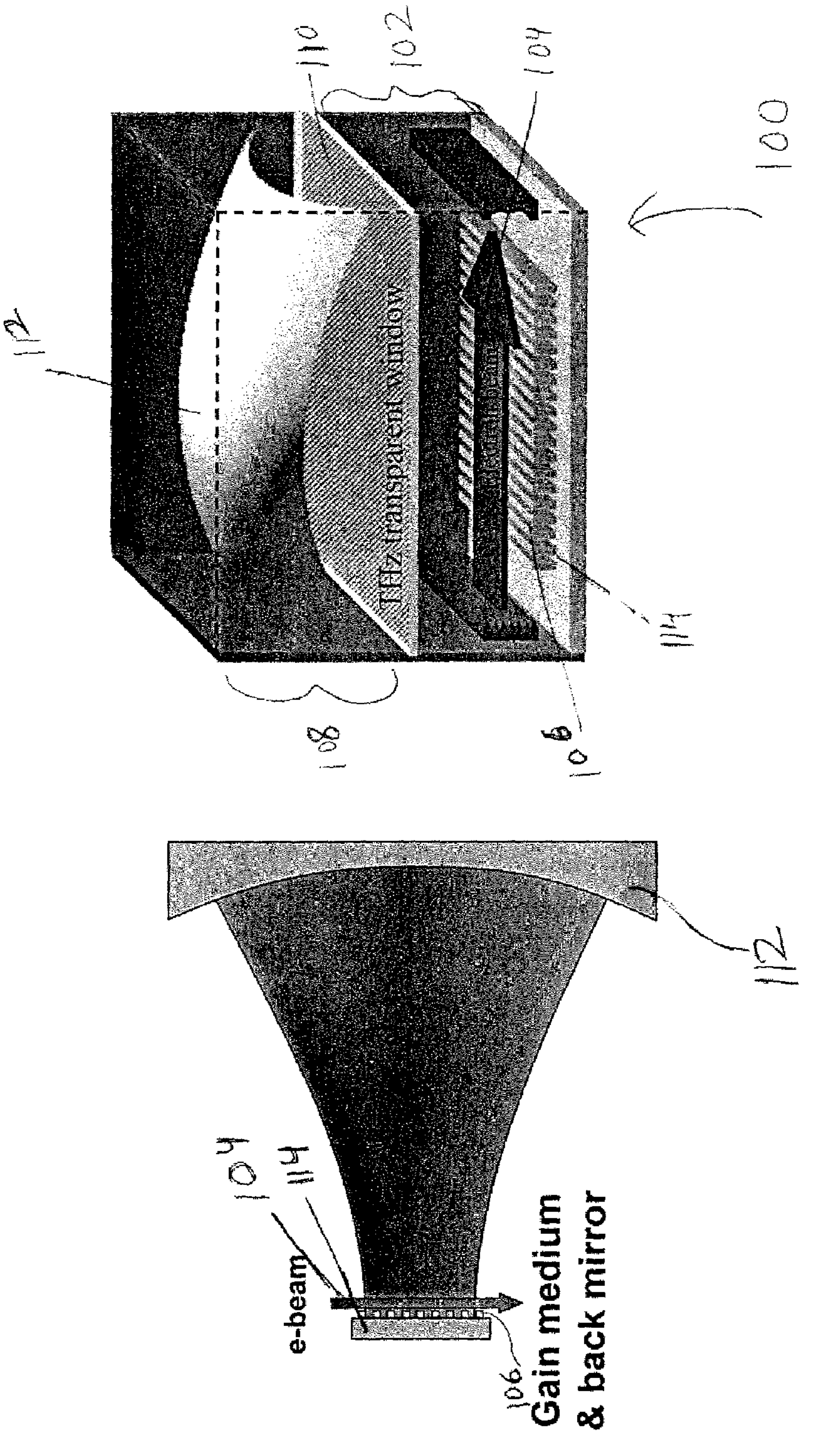
Fig. 1 (Prior Art)
FIG. 1 illustrates a pictorial of a prior art schematic configuration of an intra-cavity absorption spectrometer.
Figure 2:
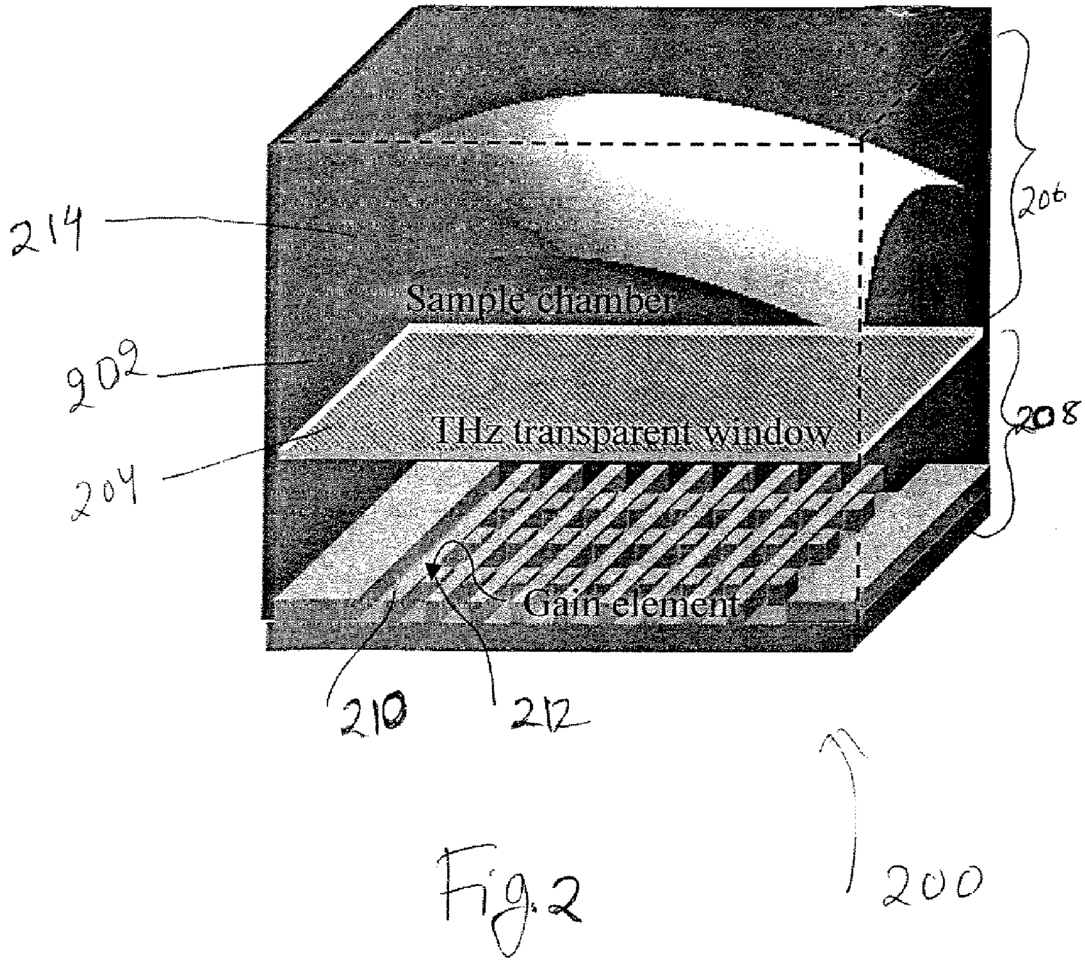
FIG. 2 illustrates a schematic configuration of an intra-cavity absorption spectrometer in accordance with one embodiment of the present invention.

Referring to FIG. 2, there is shown a schematic 3D rectangular configuration of an intra-cavity absorption spectrometer device 200 according to an exemplary embodiment of the present invention. In this embodiment, the electron beam and the grating are replaced by a different periodic structure which has active devices (gain elements) placed periodically in the structure as will be described in greater detail below.

The spectrometer device 200 comprises a cavity 202 and a Terahertz transmissive window 204 that splits the cavity 202 into the two regions defined as a sample chamber 206 and a vacuum chamber 208. Although, not shown, a sample of a gas is introduced into the sample chamber 204 for measurement. As the frequency of the resonator is changed, the gas sample will have different absorption behavior and an absorption spectrograph will be produced.

An array of waveguide elements, i.e. grating 210 is disposed in parallel within the vacuum chamber 208 as shown in FIG. 2. Additionally, a plurality of gain elements 212 arranged in a rectangular array are interspersed between the grating teeth 210 such that the elements work in parallel at the same frequency and in phase with one another. The frequency ranges preferably between 200 Ghz to 600 Ghz. This in phase behavior is brought about through the presence of a spherical mirror 214 and the resonator formed by the mirror 214 and the grating 210 as shown in FIG. 2. The gain elements 212 are arranged in parallel to increase power such that the resonator mode is designed to share power amongst gain elements 212 causing them to oscillate in phase with one another.

These solid-state gain elements 212 inside of resonator formed by spherical mirror 214 and the grating 210 configured to produce a simple source suitable for IAS integration. The IAS 200 is thus created by placing the THz transparent window 210 between the active gain elements 212 and spherical mirror 214. As shown in FIG. 2, the region between the window 210 and the spherical mirror is the sample chamber 206.

The gain medium/element 212 is preferably an output of wave-guide, which contains a solid-state gain device such as a Gunn diode or a resonant tunnel diode. Alternatively, it may be small dipole (or patch) antenna attached to a gain element 212. Note that the Gunn diodes are Just one of several active devices that are used in this configuration, and other solid-state devices may also be preferably used in the present application.

In another embodiment of the present invention, there is a shown in FIG. 3, an efficient packing arrangement 300 of gain elements 212 in a hexagonal array in the intra-cavity absorption spectrometer device. These gain elements 212 may preferably be implemented with Gunn diodes inside a small tuning chamber at the narrow end of a smooth conical horn antenna 302. Note that only the month of the horn antenna 302 is shown in the 3D configuration of FIG. 3. Additionally, a plane mirror 304 is shown to be placed on the antenna 302. Here each gain unit 212 is matched to the smooth cylindrical horn antenna 302. In this configuration, the active device is coupled through the horn into free space and generates a well behaved Gaussian wave. This approach has the advantage of retaining the circular symmetry inherent in the Gaussian mode of the resonator. The circular horns 212 fill the Gaussian beam spot formed on the plane mirror 304. Hexagonal symmetry is preserved so that the Gaussian mode is preserved between the spherical mirror 214 and the plane of the horns 212. Note that FIG. 3 shows 18 units, however, there can be more or less rings of gain units in the configuration The array of antennas as shown in FIG. 3 are placed in a planar mirror 304 that forms one side of the resonant cavity 202 and the spherical mirror 214 forms the other side. Each individual wave-guide component 212 adds to the overall power and breadth of the field formed in the resonator. The Thz transparent window 204 separates the resonator into two parts. The top part will be the sample chamber 206 and the bottom part is the vacuum chamber 208 where the active devices, i.e. gain elements 212 reside. In this way any gas sample will not affect the performance of the active devices.

Also, shown in FIG. 3, is a top view of horn array 300 showing a hexagonal packing symmetry and a side view of a single horn 302 showing the gain element resides in a box 306 at the bottom and includes tuning elements as will be described in a greater detail with respect to FIG. 4A and FIG. 4B below.

FIG. 4A illustrates a cross-section view of the exemplary resonator and the gain elements along the center line of the top view of the hexagonal horn array as shown in FIG. 3 in accordance with another embodiment of the present invention. The gain elements 212 at the base of each horn 302 preferably form negative resistance devices of the oscillator array. In this configuration, the active behavior of the device is an array of parallel tunable oscillators locked in phase by a global resonator.

FIG. 4B illustrates a cross-section of the exemplary resonator and the gain elements along, the center line of the top view of the hexagonal horn array as shown in FIG. 3 in accordance with an alternate embodiment of the present invention. The implementation, however, is different. As before, the gain elements 212 at the base of each horn 302 are preferably negative resistance devices, however, the center device is shown as a source, desirably an external low power oscillator. In this configuration, it is referred to as a master oscillator power amplifier (MOPA) which uses an externally tuned master oscillator to set the frequency. The energy distributed by the resonator to the other gain elements locks them in phase. Thus in this embodiment, the individual gain elements do not have to be tuned. By using an external broadly tunable source, the amplifier can desirably provide the increased gain while retaining the broad spectral range.

Even though various embodiments that incorporate the teachings of the present invention have been shown and described in detail herein, those skilled in the art can readily devise many other varied embodiments that still incorporate these teachings without departing from the spirit and the scope of the invention.

The invention claimed is:

1. An intra-cavity absorption spectrometer comprising:

a cavity;

a Terahertz transmissive window splitting the cavity into a sample chamber and a vacuum chamber;

an array of wave-guide elements disposed in parallel within the vacuum chamber; and a plurality of solid-state elements interspersed within the wave-guide elements, said solid-state elements oscillating in phase with one another and at the same frequency.

2. The spectrometer of claim 1 further comprises a spherical mirror positioned above said window in the sample chamber.

3. The spectrometer of claim 2 wherein said spherical mirror and said wave-guide elements form a resonator.

4. The spectrometer of claim 1 wherein said solid-state elements comprise gunn diodes.

5. The spectrometer of claim 1 wherein said sample chamber comprises a sample of a gas.

6. The spectrometer of claim 1 wherein said sample chamber and said vacuum chamber are chemically isolated from each other.

7. The spectrometer of claim 1 wherein said frequency ranges between about 200 Ghz to about 600 Ghz.

8. The spectrometer of claim 1 further comprises a spherical mirror positioned above said window in the sample chamber to form the first side of the cavity.

9. The spectrometer of claim 1 further comprising a plane mirror placed below said packaged array of solid-state elements to form the second side of the cavity.

10. The spectrometer of claim 9 further comprising a horn antenna positioned underneath said plane mirror such that the gain element is coupled through the horn antenna into free space to form a Gaussian wave.

11. The spectrometer of claim 10 wherein said each of said solid-state element forms a negative resistance at one end of the horn antenna to form an array of parallel tunable oscillators.

12. The spectrometer of claim 10 wherein one of said solid-state element is connected to an externally tuned oscillator at one end of the horn antenna to supply a fixed frequency signal to other said solid-state elements.

13. The spectrometer of claim 1 wherein said array of solid-state elements provide a coherent power source radiation comprising in the range of about 0.1 Thz to about 1.0 Thz.

14. A intra-cavity absorption spectrometer comprising:

a cavity;

a Terahertz transmissive window splitting the cavity into two sides, a first side comprising a sample chamber and a second side comprising a vacuum chamber, said vacuum chamber comprising an array of solid-state elements packaged in a specific configurations wherein said elements oscillating in phase with on-e another and at the same frequency.

15. The spectrometer of claim 14 said solid-state elements comprise gunn diodes.

16. The spectrometer of claim 14 wherein said sample chamber comprises a sample of a gas.

17. The spectrometer of claim 14 wherein said sample chamber and said vacuum chamber are chemically isolated from each other.

18. The spectrometer of claim 14 wherein said frequency ranges between about 200 Ghz to about 600 Ghz.

* * * * *